US012763551B2

(12) United States Patent
Lee et al.

(10) Patent No.: US 12,763,551 B2
(45) Date of Patent: Oct. 13, 2026

(54) VCSEL CHIP, VCSEL ARRAY, AND METHOD OF MANUFACTURING THE VCSEL ARRAY

(71) Applicant: KOREA PHOTONICS TECHNOLOGY INSTITUTE, Buk-gu Gwangju (KR)

(72) Inventors: Keon Hwa Lee, Jeonju-si (KR); Young Ho Song, Gwangju (KR)

(73) Assignee: KOREA PHOTONICS TECHNOLOGY INSTITUTE, Gwangju (KR)

( * ) Notice: Subject to any disclaimer, the term of this patent is extended or adjusted under 35 U.S.C. 154(b) by 574 days.

(21) Appl. No.: 18/234,954

(22) Filed: Aug. 17, 2023

(65) Prior Publication Data

US 2023/0396039 A1 Dec. 7, 2023

Related U.S. Application Data

(63) Continuation of application No. PCT/KR2022/003235, filed on Mar. 8, 2022.

(30) Foreign Application Priority Data

Mar. 16, 2021 (KR) ........................ 10-2021-0033718
Mar. 16, 2021 (KR) ........................ 10-2021-0033750

(51) Int. Cl.
*H01S 5/42* (2006.01)
*H01S 5/0236* (2021.01)
*H01S 5/183* (2006.01)

(52) U.S. Cl.
CPC ............ *H01S 5/423* (2013.01); *H01S 5/0236* (2021.01); *H01S 5/18341* (2013.01); *H01S 5/18344* (2013.01)

(58) Field of Classification Search
CPC ............... H01S 5/0236; H01S 5/18341; H01S 5/18344; H01S 5/209
See application file for complete search history.

(56) References Cited

U.S. PATENT DOCUMENTS 8,363,687 B2 * 1/2013 Maeda ................ H01S 5/18391 372/46.015
2003/0032209 A1 * 2/2003 Yeh ......................... H01S 5/423 438/22
2011/0148328 A1 * 6/2011 Joseph ...................... F21K 9/00 315/312
2017/0179686 A1 * 6/2017 Ryu ...................... H01S 5/4025
2019/0214788 A1 * 7/2019 Kang .................. H01S 5/18311
2020/0014169 A1 * 1/2020 Yu ......................... H01S 5/0203

FOREIGN PATENT DOCUMENTS

KR 10-2009-0077167 A 7/2009
KR 10-2018-0088110 A 8/2018
KR 10-2020-0072465 A 6/2020

* cited by examiner

*Primary Examiner* — Xinning(Tom) Niu
(74) *Attorney, Agent, or Firm* — Dinsmore & Shohl LLP; Yongosk Choi, Esq.

(57) ABSTRACT

A vertical cavity surface emitting laser (VCSEL) chip, a VCSEL array, and a method of manufacturing the VCSEL array are disclosed. The VCSEL array includes a substrate, an adhesive layer coated on the substrate, a VCSEL chip disposed on the adhesive layer and fixed to the adhesive layer and configured to oscillate light or a laser by being supplied with power, a polymer coated on the VCSEL chip and the adhesive layer, and an interconnector electrically connected to the VCSEL chip.

10 Claims, 13 Drawing Sheets

VCSEL CHIP, VCSEL ARRAY, AND METHOD OF MANUFACTURING THE VCSEL ARRAY

CROSS-REFERENCE TO RELATED APPLICATION

The present application is a continuation of International Application No. PCT/KR2022/003235 filed on Mar. 8, 2022, which claims priority under 35 U.S.C. § 119(a) to Korean application numbers 10-2021-0033718 and 10-2021-0033750, filed in the Korean Intellectual Property Office on Mar. 16, 2021, the entire disclosure of which is incorporated herein by reference. In addition, the present application claims priority for the same reasons as above for countries other than the United States, and all of the contents are incorporated into the present application by reference.

This patent is the results of research that was carried out by the support (a unique project number: 1415185090, a detailed project number: 20018154, a project name: Development of Multi-Axis Assembly System for Curved Free-Form Electronics) of Korea Evaluation Institute of Industrial Technology by the finances of the government of the Republic of Korea (Ministry of Trade, Industry and Energy) in 2023.

This patent is the results of research that was carried out by the support (a detailed project number: 20016532, a project name: Development of the system semiconductor package for augmented reality capable of detecting high-speed 3D image based on Vertical-cavity surface-emitting laser) of Korea Evaluation Institute of Industrial Technology by the finances of the government of the Republic of Korea (Ministry of Trade, Industry and Energy) in 2023.

BACKGROUND

1. Technical Field

The present disclosure relates to a vertical cavity surface emitting laser (hereinafter abbreviated as a "VCSEL"), a VCSEL array including the VCSEL, and a method of manufacturing the VCSEL array.

2. Related Art

Contents described in this part merely provide background information of the present embodiment, and do not constitute a conventional technology.

In general, a semiconductor laser diode includes an edge emitting laser diode (hereinafter abbreviated as an "EEL") and a VCSEL. The EEL has a resonant structure having a direction parallel to a stack surface of an element, and thus oscillates a laser beam in the direction parallel to the stack surface. In contrast, the VCSEL has a resonant structure having a direction vertical to a stack surface of an element, and thus oscillates a laser beam in the direction vertical to the stack surface of the element.

The VCSEL can operate by low power because it has a shorter light gain length than the EEL and can be subjected to large-scale integration. Accordingly, the VCSEL has an advantage in that it is advantageous for mass production. Furthermore, the VCSEL can oscillate a laser beam in a single longitudinal mode, and enables tests on a wafer.

Furthermore, the VCSEL facilitates coupling with an optical fiber and allows a two-dimensional (2-D) surface array to be formed because the VCSEL enables high-speed modulation and can oscillate a circular beam.

The VCSEL has been chiefly used as an optical source within an optical device for optical communication, optical interconnection, and optical pickup. However, recently, the range of use of the VCSEL is expanded up to an optical source within an image forming device, such as a LiDAR, facial recognition, motion recognition, augmented reality (AR), or virtual reality (VR) device.

As described above, the VCSEL is used in various fields. It is necessary to properly fabricate a VCSEL chip or a VCSEL array depending on the usage of the VCSEL. Conventionally, only a 2-D array using a GaAs substrate on which an epitaxy layer has grown has been manufactured. Such a 2-D array cannot have curvature because the 2-D array includes a GaAs substrate that has been used to grow the epitaxy layer of the VCSEL. Accordingly, there is a considerable difficulty in that a conventional VCSEL is implemented as a 2-D array, such as a LiDAR optical source that requires curvature.

Furthermore, recently, a method of directly transferring a VCSEL to a specific substrate (e.g., a flexible substrate) is used. There is a problem in that mass production is low because a mass transfer is difficult and process and investment costs are high.

SUMMARY

Embodiments of the present disclosure are directed to providing a vertical cavity surface emitting laser (VCSEL) chip, a VCSEL array, and a method of manufacturing a VCSEL array in a transfer manner.

Furthermore, embodiments of the present disclosure are directed to providing a VCSEL chip which can be transferred in a self-assembly manner and a VCSEL array manufactured by using the VCSEL chip.

According to an aspect of the present disclosure, a VCSEL array includes a substrate, an adhesive layer coated on the substrate, a VCSEL chip disposed on the adhesive layer and fixed to the adhesive layer and configured to oscillate light or a laser by being supplied with power, a polymer coated on the VCSEL chip and the adhesive layer, and an interconnector electrically connected to the VCSEL chip.

According to an aspect of the present disclosure, the VCSEL includes a first reflection part including a plurality of distributed Bragg reflector (DBR) pairs, a second reflection part including a plurality of DBR pairs, a cavity layer that is disposed between the first reflection part and the second reflection part and in which holes that are generated from any one of the first reflection part and the second reflection part and electrons that are generated from the other of the first reflection part and the second reflection part are recombined, an oxide layer disposed between the cavity layer and the first reflection part or the second reflection part and configured to determine characteristics of a laser to be output and the diameter of an opening, a contact layer formed within one DBR pair of the second reflection part, a first metal layer configured to come into contact with the first reflection part so that power is supplied to the first reflection part, a second metal layer configured to come into contact with the contact layer so that power is supplied to the second reflection part, an etch-stop layer disposed under the second reflection part and configured to prevent damage to the second reflection part in an etch process, and a passivation layer configured to protect the first reflection part, the second reflection part, the cavity layer, the oxide layer, the contact layer, and the etch-stop layer against an outside.

According to an aspect of the present disclosure, the second reflection part includes more DBR pairs than the first reflection part.

According to an aspect of the present disclosure, the contact layer has a mesa structure.

According to an aspect of the present disclosure, the second metal layer is disposed within the mesa structure and comes into contact with the contact layer.

According to an aspect of the present disclosure, the etch-stop layer has a mesa structure.

According to an aspect of the present disclosure, the passivation layer is applied to a part of or the entire mesa structure of the etch-stop layer.

According to an aspect of the present disclosure, the VCSEL chip includes one or more output parts.

According to an aspect of the present disclosure, the VCSEL chip has a cross section having a preset shape.

According to an aspect of the present disclosure, the preset shape is identical although the preset shape is rotated at a preset angle.

According to an aspect of the present disclosure, the preset shape is different depending on the number of output parts included in the VCSEL chip.

According to an aspect of the present disclosure, if the VCSEL chip includes a plurality of output parts, light or a laser having an identical or different wavelength is output from each of the output parts.

According to an aspect of the present disclosure, a method of manufacturing a vertical cavity surface emitting laser (VCSEL) array includes a coating process of coating an adhesive layer on a substrate, a first arrangement process of disposing the VCSEL chip on a coating layer, a coating process of coating and curing a polymer on the VCSEL chip, a removal process of removing the polymer coated on each metal layer of the VCSEL chip, and a second arrangement process of disposing an interconnector on each metal layer of the VCSEL chip.

According to an aspect of the present disclosure, a VCSEL chip includes a first reflection part including a plurality of distributed Bragg reflector (DBR) pairs, a second reflection part including a plurality of DBR pairs, a cavity layer that is disposed between the first reflection part and the second reflection part and in which holes that are generated from any one of the first reflection part and the second reflection part and electrons that are generated from the other of the first reflection part and the second reflection part are recombined, an oxide layer disposed between the cavity layer and the first reflection part or the second reflection part and configured to determine characteristics of a laser to be output and the diameter of an opening, a contact layer formed within one DBR pair of the second reflection part, a first metal layer configured to come into contact with the first reflection part so that power is supplied to the first reflection part, a second metal layer configured to come into contact with the contact layer so that power is supplied to the second reflection part, an etch-stop layer disposed under the second reflection part and configured to prevent damage to the second reflection part in an etch process, and a passivation layer configured to protect the first reflection part, the second reflection part, the cavity layer, the oxide layer, the contact layer, and the etch-stop layer against an outside.

According to an aspect of the present disclosure, the second reflection part includes more DBR pairs than the first reflection part.

According to an aspect of the present disclosure, the contact layer has a mesa structure.

According to an aspect of the present disclosure, the second metal layer is disposed within the mesa structure and comes into contact with the contact layer.

According to an aspect of the present disclosure, the etch-stop layer has a mesa structure.

According to an aspect of the present disclosure, the passivation layer is applied to a part of or the entire mesa structure of the etch-stop layer.

According to an aspect of the present disclosure, a VCSEL array includes a substrate, a first electrode disposed on the substrate, a VCSEL chip, a dam including a hollow having the same shape as a cross section of the VCSEL chip, a polymer coated on the VCSEL chip and the dam, and an interconnector electrically connected to each metal layer of the VCSEL chip.

According to an aspect of the present disclosure, the VCSEL chip includes one or more output parts.

According to an aspect of the present disclosure, the VCSEL chip has a cross section having a preset shape.

According to an aspect of the present disclosure, the preset shape is identical although the preset shape is rotated at a preset angle.

According to an aspect of the present disclosure, the preset shape is different depending on the number of output parts included in the VCSEL chip.

According to an aspect of the present disclosure, if the VCSEL chip includes a plurality of output parts, light or a laser having an identical or different wavelength is output from each of the output parts.

According to an aspect of the present disclosure, a method of manufacturing a VCSEL array includes a first arrangement process of disposing a first electrode on a substrate, a second arrangement process of disposing a dam on the first electrode, a third arrangement process of disposing a VCSEL chip within the hollow of the dam, a coating process of coating a polymer on the dam and the VCSEL chip and curing the polymer, a removal process of removing the polymer coated on each metal layer of the VCSEL chip, and a fourth arrangement process of disposing an interconnector on each metal layer of the VCSEL chip.

According to an aspect of the present disclosure, the VCSEL chip includes one or more output parts.

As described above, according to an aspect of the present disclosure, there is an advantage in that the VCSEL chip can be manufactured as the VCSEL array in a transfer manner.

Furthermore, according to an aspect of the present disclosure, there is an advantage in that the VCSEL chip can be transferred in a self-assembly manner when the VCSEL array is manufactured.

DETAILED DESCRIPTION

Figure 1:
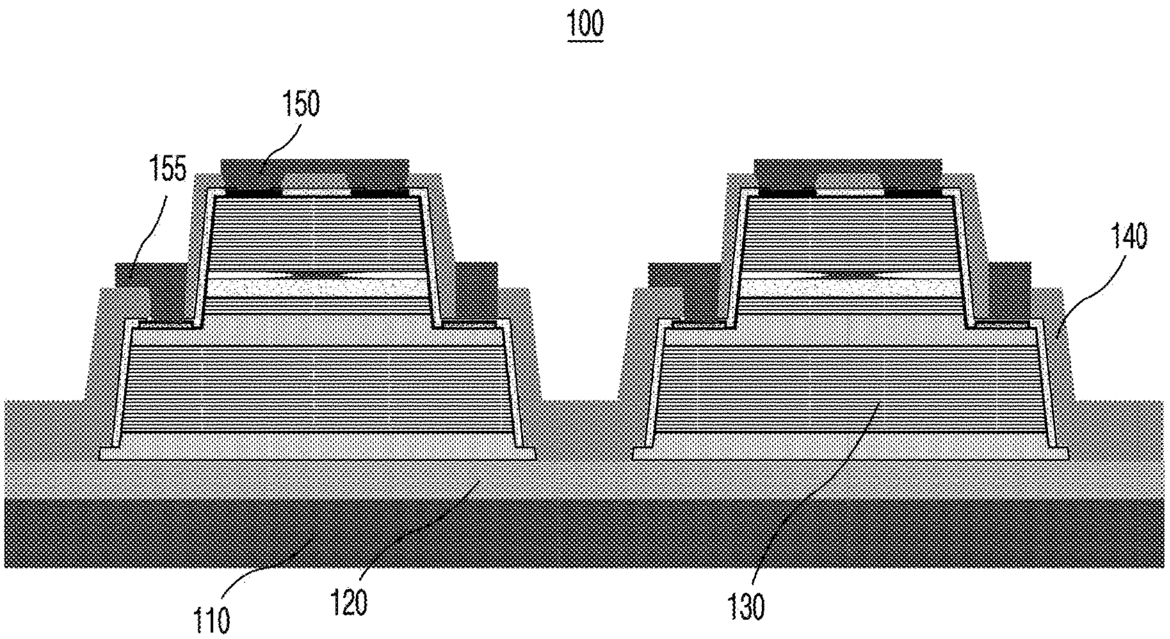
FIG. 1 is a cross-sectional view of a VCSEL array according to a first embodiment of the present disclosure.

The present disclosure may be changed in various ways and may have various embodiments. Specific embodiments are to be illustrated in the drawings and specifically described. It should be understood that the present disclosure is not intended to be limited to the specific embodiments, but includes all of changes, equivalents and/or substitutions included in the spirit and technical range of the present disclosure. Similar reference numerals are used for similar components while each drawing is described.

Terms, such as a first, a second, A, and B, may be used to describe various components, but the components should not be restricted by the terms. The terms are used to only distinguish one component from another component. For example, a first component may be referred to as a second component without departing from the scope of rights of the present disclosure. Likewise, a second component may be referred to as a first component. The term “and/or” includes a combination of a plurality of related and described items or any one of a plurality of related and described items.

When it is described that one component is “connected” or “coupled” to the other component, it should be understood that one component may be directly connected or coupled to the other component, but a third component may exist between the two components. In contrast, when it is described that one component is “directly connected to” or “directly coupled to” the other component, it should be understood that a third component does not exist between the two components.

Terms used in this application are used to only describe specific embodiments and are not intended to restrict the present disclosure. An expression of the singular number includes an expression of the plural number unless clearly defined otherwise in the context. In this specification, a term, such as “include” or “have”, is intended to designate the presence of a characteristic, a number, a step, an operation, a component, a part or a combination of them, and should be understood that it does not exclude the existence or possible addition of one or more other characteristics, numbers, steps, operations, components, parts, or combinations of them in advance.

All terms used herein, including technical terms or scientific terms, have the same meanings as those commonly understood by a person having ordinary knowledge in the art to which the present disclosure pertains, unless defined otherwise in the specification.

Terms, such as those defined in commonly used dictionaries, should be construed as having the same meanings as those in the context of a related technology, and are not construed as ideal or excessively formal meanings unless explicitly defined otherwise in the application.

Furthermore, each construction, process, procedure, or method included in each embodiment of the present disclosure may be shared within a range in which the constructions, processes, procedures, or methods do not contradict each other technically.

FIG. 1 is a cross-sectional view of a vertical cavity surface emitting laser (VCSEL) array according to an embodiment of the present disclosure.

Referring to FIG. 1, a VCSEL array 100 according to an embodiment of the present disclosure includes a substrate 110, an adhesive layer 120, a VCSEL chip 130, a polymer 140, and interconnectors 150 and 155.

The VCSEL array 100 means an optical element in which a plurality of VCSEL chips 130 is disposed in an array form and which vertically outputs light (or a laser) having predetermined intensity or more. The VCSEL array 100 includes a plurality of VCSEL chips, in general, several tens or several hundreds of VCSEL chips in order to output light having predetermined intensity or more. The VCSEL chip may include one (light) output part or a plurality of output parts. FIG. 1 illustrates that the VCSEL chip includes one output part, but the present disclosure is not essentially limited thereto.

The substrate 110 supports components within the VCSEL array 100.

The adhesive layer 120 is coated on the substrate 110 so that the VCSEL chip 130 can be seated in the substrate 110. The adhesive layer 120 has an adhesive force of a degree in which the VCSEL chip 130 can be seated on the substrate 110 and fixed thereto. Accordingly, the adhesive layer 120 is coated on the substrate 110 and fixes the VCSEL chip 130 that is seated on the top thereof.

The VCSEL chip 130 oscillates light or a laser by being supplied with power. The VCSEL chip 130 is seated in the adhesive layer 120, and oscillates light or a laser in a direction opposite to the direction in which the substrate 110 is disposed. The VCSEL chip may include one (light) output part (or emitter), and may include a plurality of output parts. Furthermore, if the VCSEL chip 130 includes a plurality of output parts, all of the output parts may output light having the same wavelength band or some or all of the output parts may output light having different wavelength bands. A detailed structure of the VCSEL chip 130 is described later with reference to FIGS. 2 to 4.

The polymer 140 is coated on the tops (i.e., a direction opposite to the direction in which the substrate is disposed on the basis of the VCSEL chip) of the adhesive layer 120 and the VCSEL chip 130 and cured, so that the polymer 140 fixes the VCSEL chip 130 and prevents the exposure of the adhesive layer 120 and the VCSEL chip 130 to an external environment. As the polymer 140 is coated on the top of the VCSEL chip 130, the VCSEL chip 130 can be fully fixed by the adhesive layer 120 and the polymer 140. Furthermore, the polymer 140 can prevent damage or breakage which may occur due to an external environment because the top of the VCSEL chip 130 is exposed to the outside.

The interconnectors 150 and 155 are electrically connected to metal layers of the VCSEL chip 130. The interconnectors 150 and 155 are connected to respective metal layers within the VCSEL chip 130 via the polymer 140. The metal layers within the VCSEL chip 130 may be exposed to the outside by the interconnectors 150 and 155. As power is supplied to the interconnectors 150 and 155, the power can be applied to the VCSEL chip 130.

Figure 2:
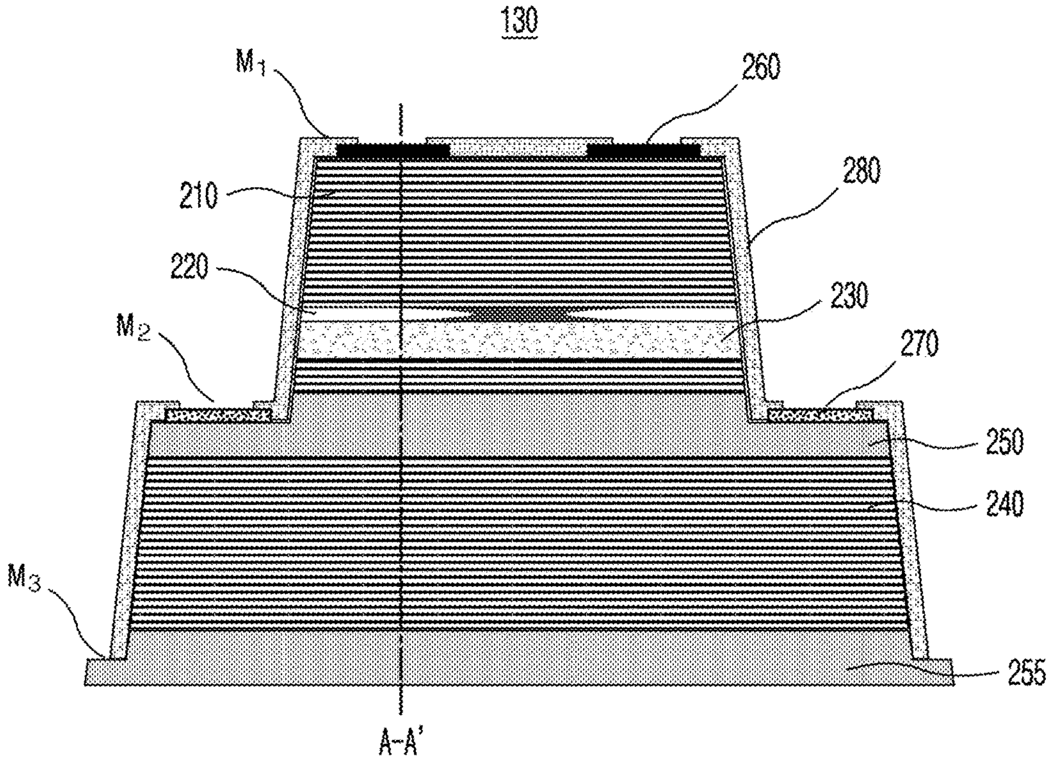
FIG. 2 is a cross-sectional view of a VCSEL chip in one direction according to the first embodiment of the present disclosure.
Figure 3:
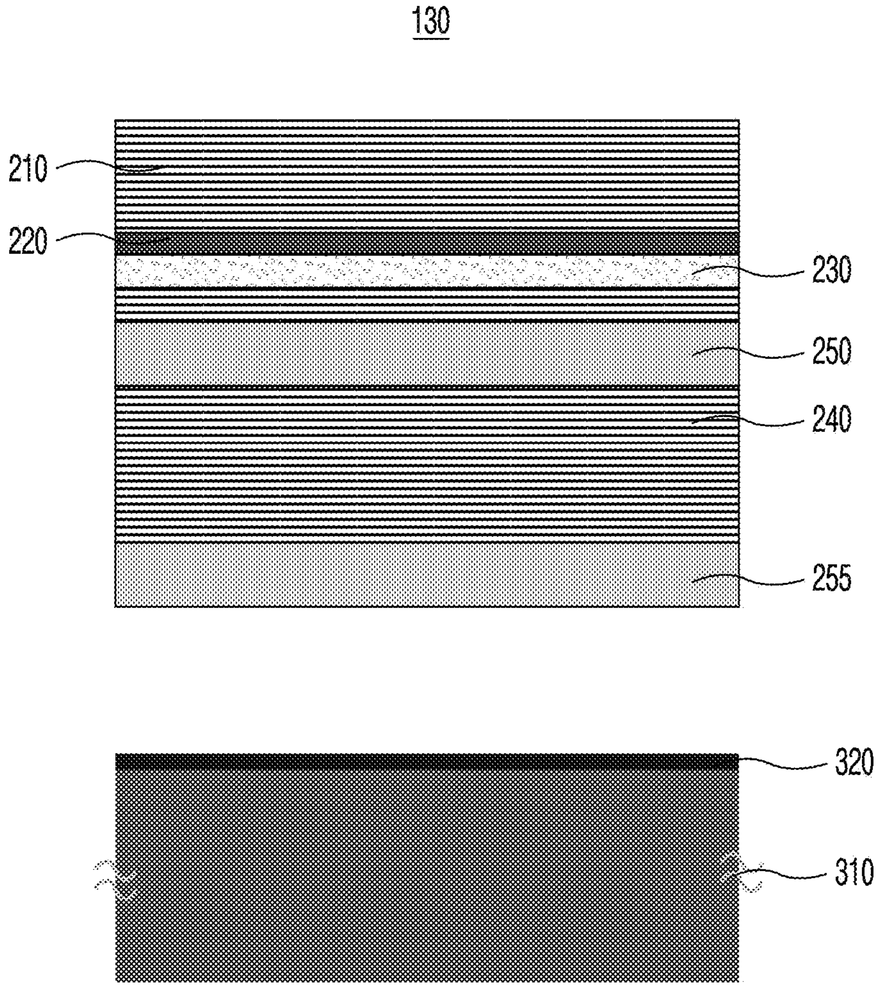
FIG. 3 is a cross-sectional view of VCSEL epitaxy in the other direction according to the first embodiment of the present disclosure.

FIG. 2 is a cross-sectional view of the VCSEL chip in one direction according to an embodiment of the present disclosure. FIG. 3 is a cross-sectional view of VCSEL epitaxy in the other direction according to an embodiment of the present disclosure.

Referring to FIGS. 2 and 3, the VCSEL chip 130 according to an embodiment of the present disclosure includes a first reflection part 210, an oxide layer 220, a cavity layer 230, a second reflection part 240, a first contact layer 250, an etch-stop layer 255, a first metal layer 260, a second metal layer 270, and a passivation layer 280.

The first reflection part 210 may be composed of a semiconductor material into which a p type dopant has been doped, and may be composed of AlGaAs, that is, a semiconductor material including aluminum (Al). The first reflection part 210 includes a plurality of distributed Bragg reflector (DBR) pairs. The DBR pair is implemented by a plurality of pairs, each one including a high Al composition layer having a high Al ratio of 85 to 100% and a low Al composition layer having a low Al ratio of 0 to 20%. The first reflection part 210 includes a smaller number of DBR pairs than the second reflection part 240, and has relatively lower reflectivity. Accordingly, light or a laser that is oscillated by the cavity layer 230 is oscillated toward the first reflection part 210 having low reflectivity because the first reflection part 210 has a relatively smaller number of DBR pairs.

The ratio of Al included in the high Al composition layer of the first reflection part 210 is relatively smaller than that of the second reflection part 240. Accordingly, reflection parts within the VCSEL chip 130 according to an embodiment of the present disclosure can maintain the same reflectivity, and a total thickness of the VCSEL chip 130 can also be reduced compared to a conventional technology.

The oxide layer 220 corresponds to a portion that has been oxidized by a predetermined length through an oxidation process. The oxide layer 220 determines characteristics of a laser that is output and the diameter of an opening depending on the length of the oxidized portion. The oxide layer 220 includes Al having a higher concentration than Al of the first reflection part 210 and the second reflection part 240. The higher the Al concentration, the higher the speed at which the oxide layer is oxidized. The oxide layer 220 can be selectively oxidized when being subsequently oxidized because the oxide layer 220 is implemented to have a relatively higher Al concentration than the reflection parts 210 and 240. For example, the oxide layer 220 may be implemented by AlGaAs having an Al ratio of 98% or more. Each of the reflection parts 210 and 240 may be implemented by AlGaAs having an Al ratio of 0% to 100%. FIG. 2 illustrates that the oxide layer 220 has been formed at a location that neighbors the first reflection part 210, but the present disclosure is not essentially limited. The oxide layer 220 may be formed at a location that neighbors the second reflection part 240 or both locations that neighbor the first reflection part 210 and the second reflection part 240.

The cavity layer 230 is a layer in which holes that are generated from the first reflection part 210 and electrons that are generated from the second reflection part 240 are met and recombined. Light is generated by the recombination of the electrons and the holes. The cavity layer 230 may include a multi-quantum well (MQW) structure having a single quantum well (SQW) or a plurality of quantum well layers. If the cavity layer 230 has the MQW structure, the cavity layer 230 has a structure in which well layers (not illustrated) having different energy bands and a barrier layer (not illustrated) are alternately stacked once or more. The well layer (not illustrated)/barrier layer (not illustrated) of the cavity layer 230 may be composed of InGaAs/AlGaAs, InGaAs/GaAs, or GaAs/AlGaAs.

The second reflection part 240 may be implemented by an n type semiconductor layer into which an n type dopant has been doped, and may be composed of AlGaAs, that is, a semiconductor material including Al. Likewise, the second reflection part 240 also includes a plurality of DBR pairs. However, as described above, the second reflection part 240 has relatively high reflectivity because the second reflection part 240 has a relatively larger number of DBR pairs than the first reflection part 210. Accordingly, light or a laser that is oscillated by the cavity layer 230 is oscillated toward the first reflection part 210 having low reflectivity because the first reflection part 210 has a relatively small number of DBR pairs.

The first contact layer 250 is formed in the low Al composition layer of one DBR pair of the second reflection part 240. As the first contact layer 250 is formed within the second reflection part 240, the VCSEL chip 130 may have an intra VCSEL structure. The first contact layer 250 is formed in the low Al composition layer of one DBR pair, but may be implemented by a GaAs component unlike the low Al composition layer. However, the GaAs component has a characteristic in that the GaAs component absorbs some of light or a laser that oscillates. Accordingly, the first contact layer 250 is formed at a location that is distant from the cavity layer 230 by a preset distance. As the first contact layer 250 is separated from the cavity layer 230 by the preset distance, the VCSEL chip 130 has an intra VCSEL structure and can also minimize the absorption of light or a laser. In this case, the preset distance may be a location that is separated from the cavity layer 230 by a plurality of pairs (i.e., a high Al composition layer and a low Al composition layer), in particular, by 4 to 5 pairs. As the first contact layer 250 is formed at a location separated from the cavity layer 230 by the preset distance, the first contact layer 250 can have the aforementioned characteristic.

The first contact layer 250 has a relatively greater thickness than one DBR pair by m times. Accordingly, the second reflection part 240 is connected to the second metal layer 270, and the VCSEL chip 130 can also have a mesa structure $M_2$. As the first contact layer 250 has a relatively greater thickness, etching can be performed up to one location (i.e., the etch stop layer 255) of the first contact layer 250 without a difficulty. Etching is performed up to one area at both ends of the first reflection part 210, the oxide layer 220, the cavity layer 230, and the second reflection part 240 and one area of the first contact layer 250, so that a mesa structure $M_2$ is formed. Furthermore, as etching is performed up to one area of the first contact layer 250 and the first contact layer 250 is exposed to the outside, the second metal layer 270 may be disposed in the exposed portion of the first contact layer 250.

The etch-stop layer 255 is formed under the second reflection part 240 (i.e., a direction opposite to the direction in which the first reflection part 210 is disposed on the basis of the second reflection part 240), and protects the second reflection part 240 in a process of etching a sacrificial layer 320. Like the first contact layer 250, the second reflection part 240 is implemented by a GaAs component and has a preset thickness. As the etch-stop layer 255 is formed under the second reflection part 240, the etch-stop layer 255 protects damage to the second reflection part 240 in a process of separating the VCSEL chip 130 that has been grown on the substrate 310.

The first metal layer 260 comes into contact with the first reflection part 210 so that power can be supplied to the first reflection part 210. The first metal layer 260 may be p-metal, such as titanium (Ti), platinum (Pt), or gold (Au). As the first metal layer 260 is formed at the top of the first reflection part 210 (in FIG. 2), the first metal layer 260 transfers, to the first reflection part 210, power that is applied via the polymer 140.

The second metal layer 270 comes into contact with the first contact layer 250 so that power can be supplied to the second reflection part 240. The second metal layer 270 may be n-metal unlike the first metal layer 260. The VCSEL chip 130 has a shape that has been etched as the mesa structure $M_2$ up to one location of the first reflection part 210 to the first contact layer 250. By such etching, part of the first contact layer 250 is exposed to the outside. The second metal layer 270 is disposed at the exposed location of the first contact layer 250. As the second metal layer 270 is formed at the top of the second reflection part 240 and the first contact layer 250 (in FIG. 2), the second metal layer 270 transfers, to the second reflection part 240, power that is applied from the outside.

However, the polarity of the first metal layer 260 and the second metal layer 270 is a polarity if a case in which (+) power is applied to the interconnector 150 and (−) power is applied to the interconnector 155 is assumed. If the polarities of the power applied to the interconnectors 150 and 155 are different from each other, the first metal layer 260 and the second metal layer 270 may have opposite polarities.

The VCSEL chip 130 has a plurality of mesa structures. Etching is primarily performed up to one location of the first contact layer 250 as the mesa structure $M_2$, and is additionally performed up to part of the etch-stop layer 255 as a mesa structure $M_3$. Accordingly, the VCSEL chip 130 has three mesa structures.

The passivation layer 280 is applied to part of the first metal layer 260, part of the second metal layer 270, and the side surfaces of the remaining components except the first metal layer 260 and the second metal layer 270, and protects the components against the outside. In this case, as illustrated in FIG. 2, the passivation layer 280 may be applied to up to only the etched portion of the etch-stop layer 255, and may not be applied to the entire etched portion (i.e., the entire mesa structure M 3). If the passivation layer 280 is applied as illustrated in FIG. 2, other components (e.g., 240 and 255) are relatively more exposed to an etchant, but the passivation layer 280 does not need to have a mesa structure. Accordingly, an application process can be relatively simplified. In contrast, unlike in FIG. 2, the passivation layer 280 may be applied to the entire mesa structure $M_3$ of the etch-stop layer. If the passivation layer 280 has the mesa structure and is applied as described above, the application process becomes somewhat complicated, but the exposure of other components (e.g., 240 and 255) to an etchant can be minimized in a process of etching the sacrificial layer 320 to be described later by the etchant. Accordingly, damage to other components (e.g., 240 and 255) attributable to the etchant can be minimized.

The components of the VCSEL chip 130 are grown on a substrate 310. The sacrificial layer 320 is grown between the components of the VCSEL chip 130 and the substrate 310. The sacrificial layer 320 is etched by the etchant, and the substrate 310 and the VCSEL chip 130 are separated from each other.

As the VCSEL chip 130 has such a structure, the VCSEL chip 130 can be easily transferred to the substrate.

FIGS. 4A through 4E are schematic plan views of the VCSEL chip within the VCSEL array according to an embodiment of the present disclosure.

The VCSEL chip has a different form (of a cross section) depending on the number of output parts included in the VCSEL chip. However, although any number of output parts is included in the VCSEL chip, a cross section of the VCSEL chip 130 is implemented to have a preset shape. In this case, the preset shape means that the preset shape is identical although the preset shape is rotated at a predetermined angle. As described above, as the VCSEL chip 130 has the preset shape, the VCSEL chip 130 can be fully seated in the substrate 110 and operate in a process of the VCSEL chip 130 being transferred to the substrate 110 in a manufacturing process of the VCSEL array.

FIGS. 4A to 4E are plan views of the VCSEL chips 130 depending on the number of output parts included in each VCSEL chip.

Figure 4A:
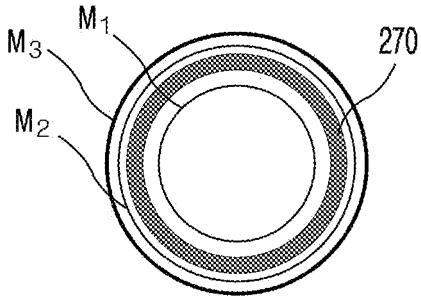
FIGS. 4A to 4E are schematic plan views of the VCSEL chip within the VCSEL array according to the first embodiment of the present disclosure.

Referring to FIG. 4A, if one output part is included in the VCSEL chip 130, the VCSEL chip 130 has a circular cross section. If the VCSEL chip 130 is formed as described above, the VCSEL chip 130 may have the same shape although the VCSEL chip 130 is rotated at any angle.

Figure 4B:
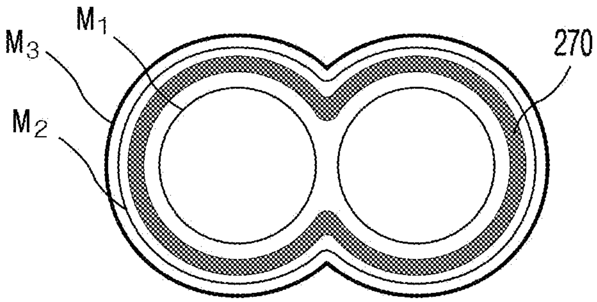

If two output parts are included in the VCSEL chip 130, the VCSEL chip 130 is formed as illustrated in FIG. 4B. Two circular mesa structures M1 are formed in parallel. If the two circles are disposed in parallel, the second metal layer 270 is implemented in a form in which only the contours (i.e., the outskirts in which the two circles do not face each other) of the two circles are connected. The mesa structure M2 and the mesa structure M3 each are formed identically with a form of the second metal layer 270. If the VCSEL chip 130 is formed as described above, the VCSEL chip 130 may have the same shape although the VCSEL chip 130 is rotated 180°.

Figure 4C:
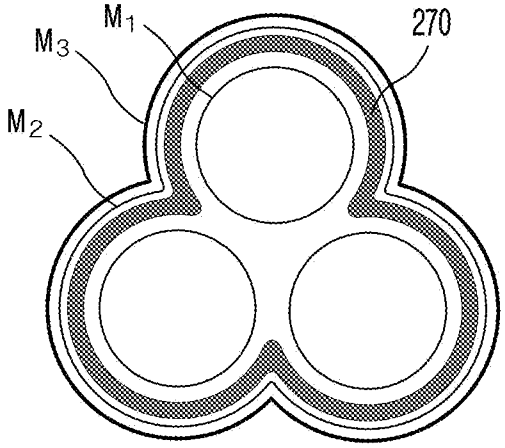

If three output parts are included in the VCSEL chip, the VCSEL chip 130 is formed as illustrated in FIG. 4C. Three circular mesa structures $M_1$ are formed in a form in which the three circular mesa structures are adjacent to each other (i.e., any one mesa structure $M_1$ is adjacent to the remaining two mesa structures $M_1$).

If the three circles are disposed to be adjacent to each other, the second metal layer 270 is implemented in a form in which only the contours (i.e., the outskirts in which the three circles do not face each other) of the three circles are connected. The mesa structure $M_2$ and the mesa structure $M_3$ each are formed identically with a form of the second metal layer 270. If the VCSEL chip 130 is formed as described above, the VCSEL chip 130 may have the same shape although the VCSEL chip 130 is rotated 120°.

Figure 4D:
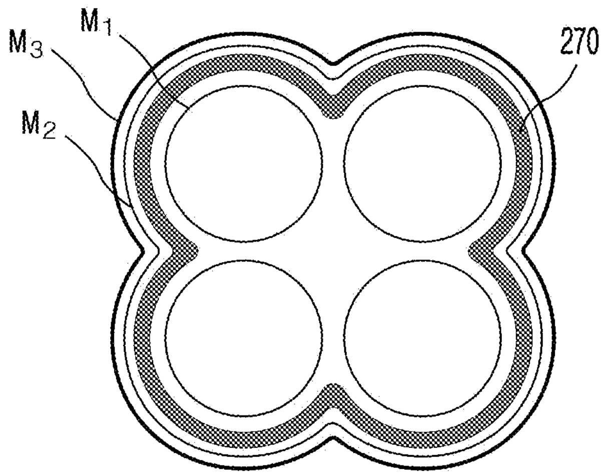

If four output parts are included in the VCSEL chip 130, the VCSEL chip 130 is formed as illustrated in FIG. 4D. Any one of four circular mesa structures $M_1$ is formed to be adjacent to the remaining two mesa structures. If the four circles are disposed like the mesa structures $M_1$, the second metal layer 270 is implemented in a form in which only the contours (i.e., the outskirts in which the four circles do not face each other) of the four circles) are connected. The mesa structure $M_2$ and the mesa structure $M_3$ each are formed identically with a form of the second metal layer 270. If the VCSEL chip 130 is formed as described above, the VCSEL chip 130 may have the same shape although the VCSEL chip 130 is rotated 90°.

Figure 4E:
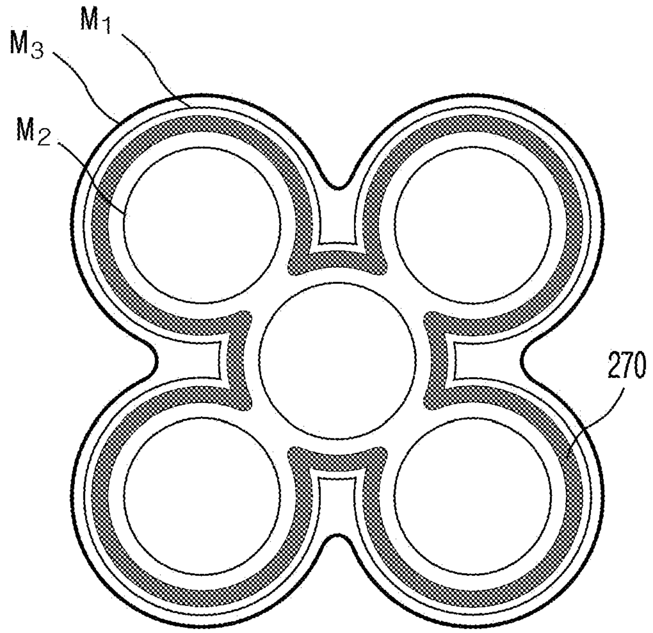

If five output parts are included in the VCSEL chip, the VCSEL chip 130 is formed as illustrated in FIG. 4E. Any one of four mesa structures $M_1$, among five circular mesa structures $M_1$, is formed to neighbor the remaining two mesa structures. The remaining one mesa structure $M_1$, among the five circular mesa structures $M_1$, is formed to neighbor all of the remaining four mesa structures $M_1$. If the five circles are disposed like the mesa structures $M_1$, the second metal layer 270 is implemented in a form in which only the contours (i.e., the outskirts in which the five circles do not face each other) of the four circles any one of which is formed to neighbor the remaining two mesa structures. The mesa structure $M_2$ and the mesa structure $M_3$ each are formed identically with a form of the second metal layer 270. If the VCSEL chip 130 is formed as described above, the VCSEL chip 130 may have the same shape although the VCSEL chip 130 is rotated 90°.

A method of manufacturing the VCSEL array is illustrated in FIGS. 5 to 10.

Figure 5:
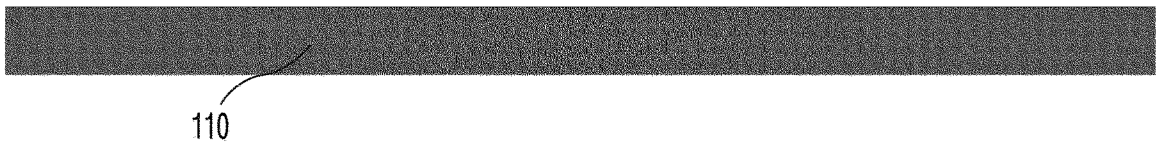
FIGS. 5 to 10 are diagrams illustrating a method of manufacturing the VCSEL array according to the first embodiment of the present disclosure.
Figure 6:
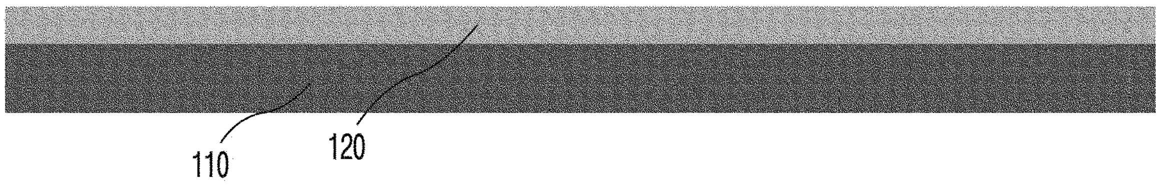

As illustrated in FIGS. 5 and 6, the adhesive layer 120 is coated on the substrate 110.

Figure 7:
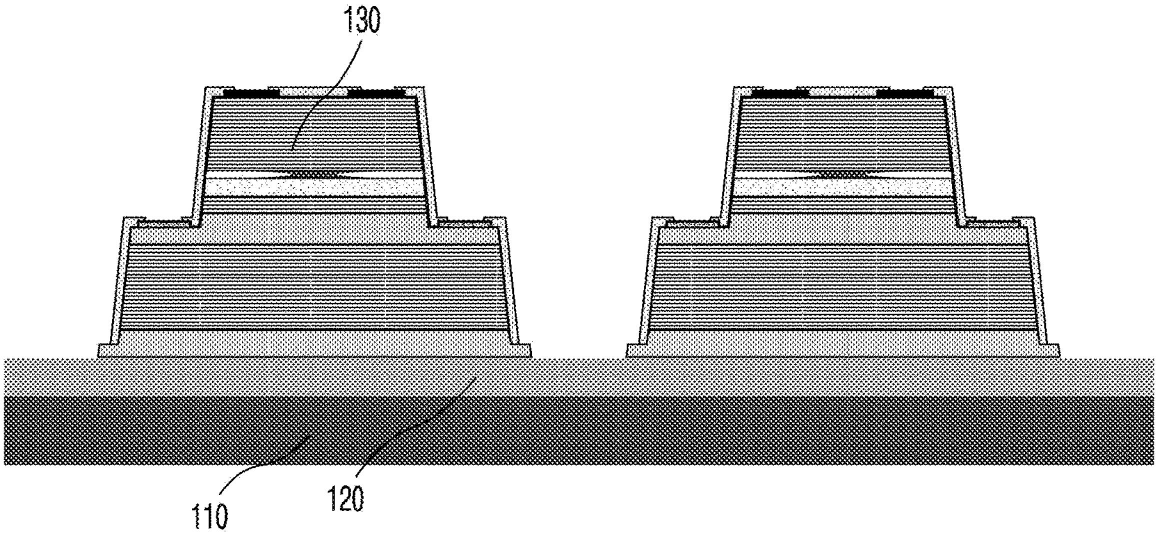

Next, as illustrated in FIG. 7, the VCSEL chip 130 is disposed on the adhesive layer 120. The VCSEL chip 130 is disposed on the adhesive layer 120 and fixed thereto. The VCSEL chips 130 are disposed at a proper interval depending on the number of VCSEL chips to be included in a VCSEL array to be manufactured.

Figure 8:
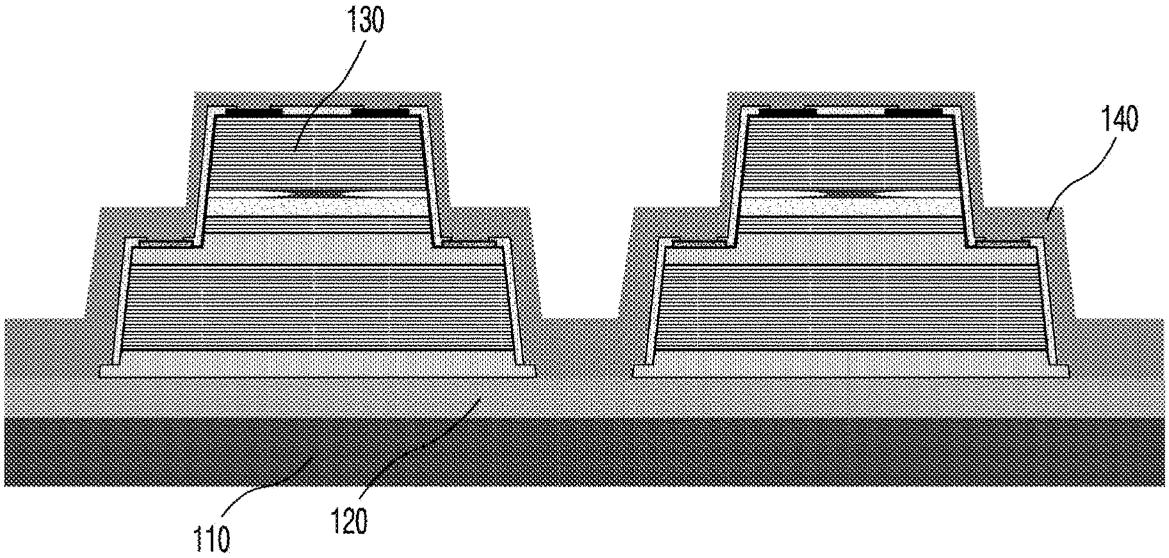

Next, as illustrated in FIG. 8, the polymer 140 is coated on the adhesive layer 120 and the VCSEL chip 130 and then cured.

Figure 9:
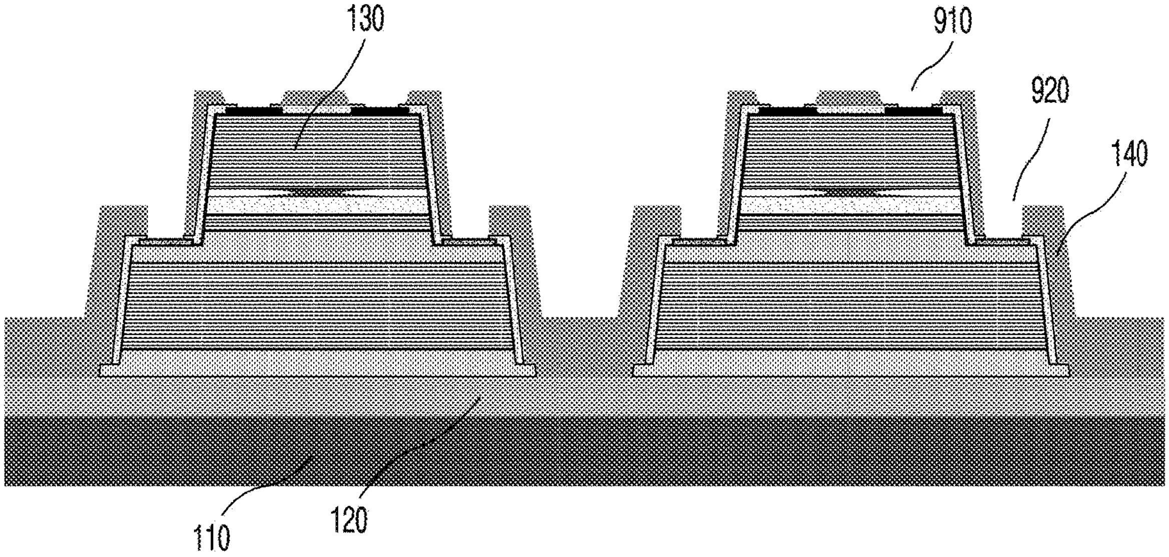

Next, as illustrated in FIG. 9, polymers 910 and 920 at locations of the first metal layer 260 and the second metal layer 270 within the VCSEL chip 130 are removed.

Figure 10:
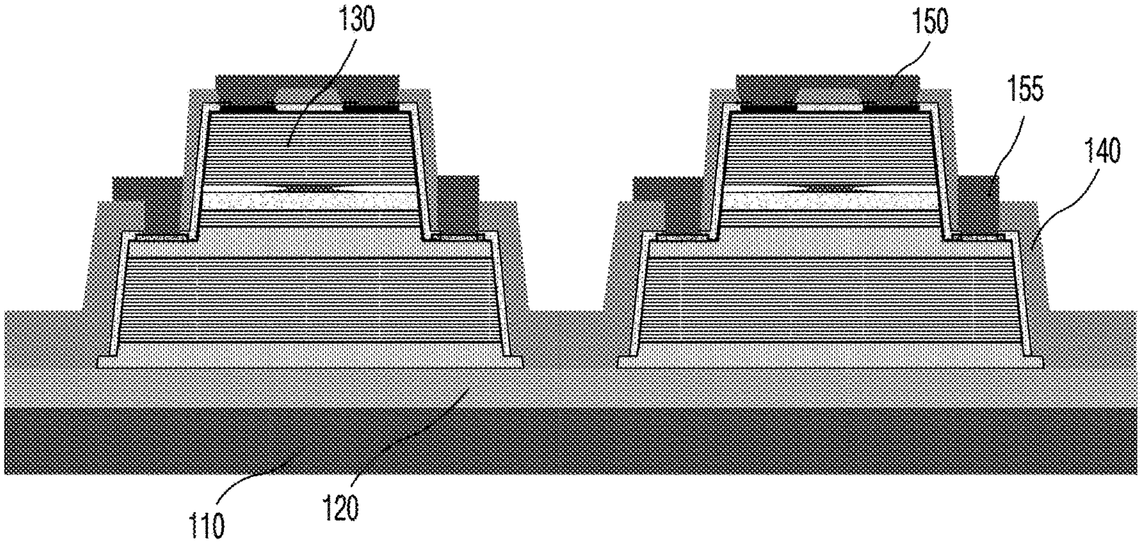

Finally, as illustrated in FIG. 10, the interconnectors 150 and 155 are disposed at the locations from which the polymers have been removed, respectively, and are electrically connected to the first metal layer 260 and the second metal layer 270 within the VCSEL chip 130, respectively.

Figure 11:
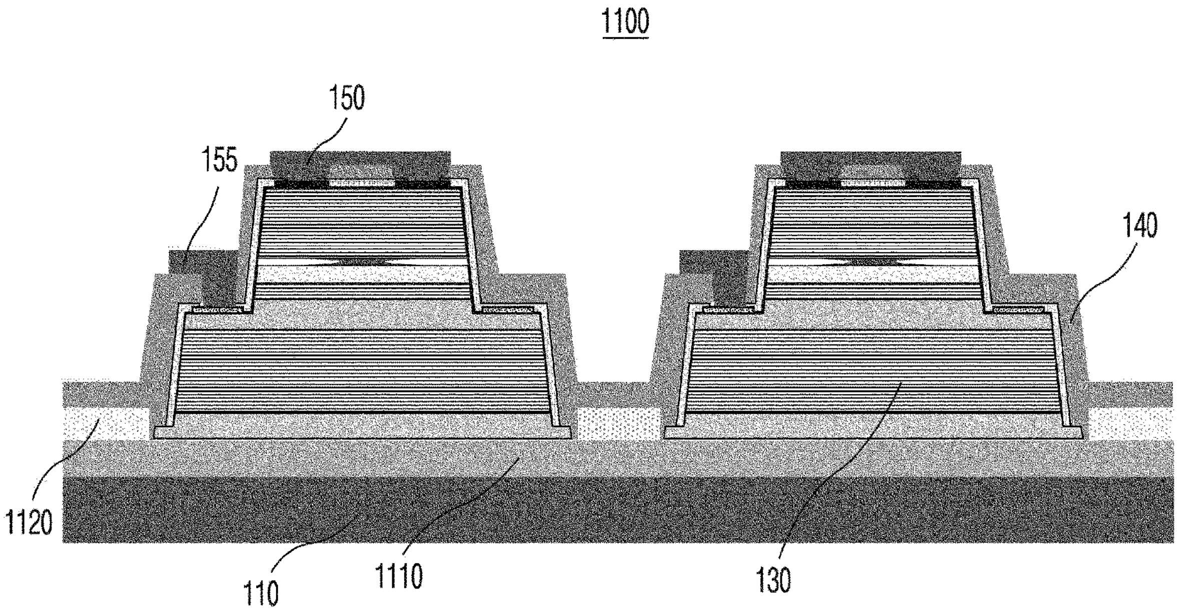
FIG. 11 is a cross-sectional view of a VCSEL array according to a second embodiment of the present disclosure.

FIG. 11 is a cross-sectional view of a VCSEL array according to a second embodiment of the present disclosure.

Referring to FIG. 11, a VCSEL array 1100 according to the second embodiment of the present disclosure includes a substrate 110, a first electrode 1110, a dam 1120, a VCSEL chip 130, a polymer 140, and interconnectors 150 and 155. Components having the same reference numerals as components of the VCSEL array 100, among the components of the VCSEL array 1100, perform the same operations as the components of the VCSEL array 100, and thus a detailed description thereof is omitted.

The first electrode 1110 is disposed on the substrate 110, and supplies power that allows the VCSEL chip 130 to be seated in the substrate 110. The first electrode 1110 is disposed on the substrate 110 and supplies power so that the VCSEL chip 130 can be autonomously assembled on the substrate 110, in particular, within the hollow of the dam 1120.

The dam 1120 has a preset shape, and allows the VCSEL chip 130 to be disposed on the first electrode 1110 and fixed thereto. The dam 1120 includes the hollow that has the same shape as a cross section (more specifically, a cross section of the end of the VCSEL chip disposed on the substrate 110) of the VCSEL chip 130 and that has a wider internal area than a cross sectional area of the VCSEL chip. The VCSEL chip is disposed within the hollow of the dam 1120, and may be fixed by the dam 1120. A form of the cross section and cross sectional area of the VCSEL chip are different depending on the number of output parts included in the VCSEL chip. Accordingly, a form and area of the hollow of the dam 1120 are also different. Accordingly, the dam 1120 includes the hollow in which the VCSEL chip 130 is suitably seated, and fixes the VCSEL chip 130. A detailed structure of the dam 1120 is illustrated in FIGS. 12A to 12C.

Figure 12A:
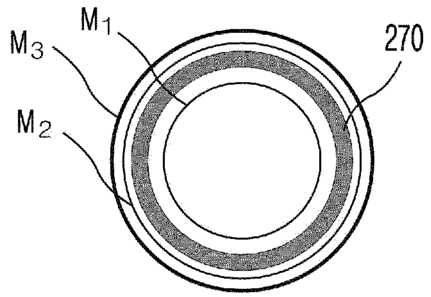
FIGS. 12A to 12C are schematic plan views of a VCSEL chip within the VCSEL array according to the second embodiment of the present disclosure.
Figure 12B:
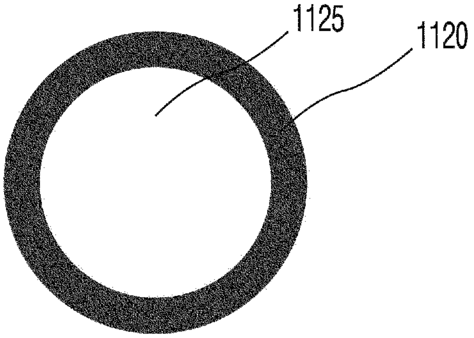
Figure 12C:
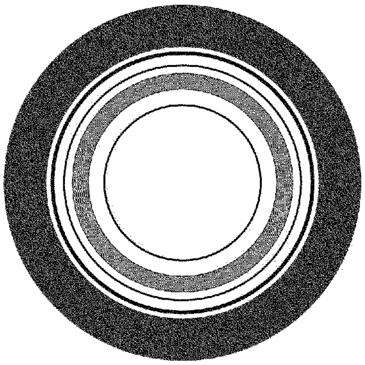

FIGS. 12A to 12C are schematic plan views of the VCSEL chip within the VCSEL array according to the second embodiment of the present disclosure.

Referring to FIGS. 12A to 12C, as described above, the VCSEL chip has a different form and area (of a cross section) depending on the number of output parts included in the VCSEL chip. However, any number of output parts is included in the VCSEL chip, the cross section of the VCSEL chip 130 and the hollow of the dam 1120 are implemented in a preset shape. In this case, the preset shape means that the preset shape is identical although the preset shape is rotated at a predetermined angle. As described above, as the VCSEL chip 130 and the dam 1120 have the preset shape, the VCSEL chip 130 and the dam 1120 can be fully seated in the substrate 110 and operate although the VCSEL chip 130 is rotated in a process of the VCSEL chip 130 being self-assembled in the substrate 110 in a process of manufacturing the VCSEL array.

FIGS. 12A to 12C are plan views if the VCSEL chip 130 including one output part, the dam 1120, and the VCSEL chip 130 within the dam are seated.

Referring to FIGS. 12A to 12C, if one output part is included in the VCSEL chip, as illustrated in FIG. 12A, the VCSEL chip 130 has a circular cross section. As illustrated in FIG. 12B, the dam 1120 also has a circular hollow like the VCSEL chip 130. Accordingly, as illustrated in FIG. 12C, one VCSEL chip 130 is seated within the hollow of the dam 1120 and coupled thereto. If the VCSEL chip 130 is formed as described above, the VCSEL chip 130 may have the same shape although the VCSEL chip 130 is rotated at any angle.

FIGS. 12A to 12C illustrate only a case in which the VCSEL chip 130 includes one output part, but the present disclosure is not essentially limited thereto. If the VCSEL chip 130 is implemented as illustrated in FIGS. 4A to 4E, the dam 1120 has a hollow having the same shape as that of the cross section of the VCSEL 130 so that the VCSEL chip 130 is seated in the hollow.

Referring back to FIG. 11, the VCSEL chip 130 is disposed in a space between the dams 1120, and oscillates light or a laser by power supplied thereto.

The polymer 140 is coated on the top (i.e., a direction opposite to the direction in which the substrate is disposed on the basis of the VCSEL chip) of the dam 1120 and the VCSEL chip 130 and then cured, thus fixing the dam 1120 and the VCSEL chip 130 and prevents the dam 1120 and the VCSEL chip 130 from being exposed to an external environment. As the polymer 140 is coated on the dam 1120 and the VCSEL chip 130, the VCSEL chip 130 can be fully fixed by the dam 1120 and the polymer 140, and the dam 1120 can be fully fixed by the polymer 140. Furthermore, the polymer 140 can prevent damage or breakage of the dam 1120 and the VCSEL chip 130, which may occur due to an external environment, because the tops of the dam 1120 and the VCSEL chip 130 are exposed to the outside.

Figure 13:
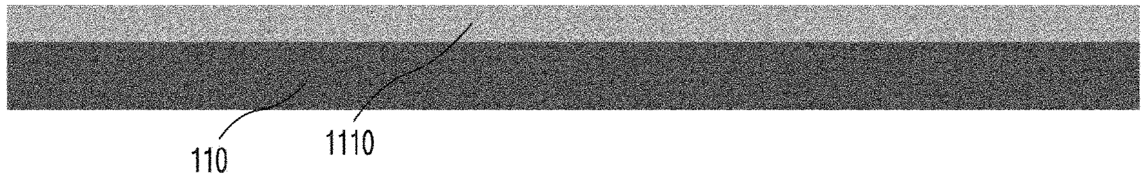
FIGS. 13 to 15 are diagrams illustrating some of a method of manufacturing the VCSEL array according to the second embodiment of the present disclosure.
Figure 14:
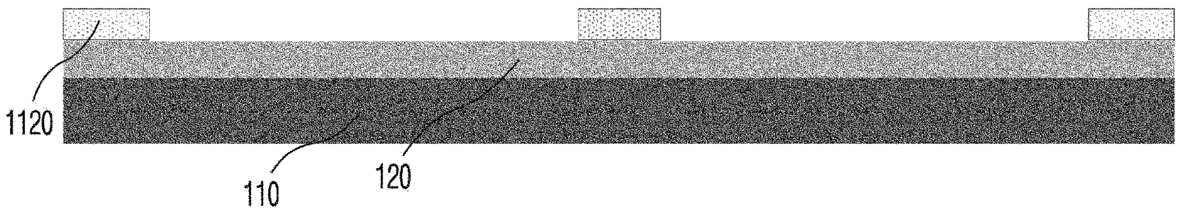
Figure 15:
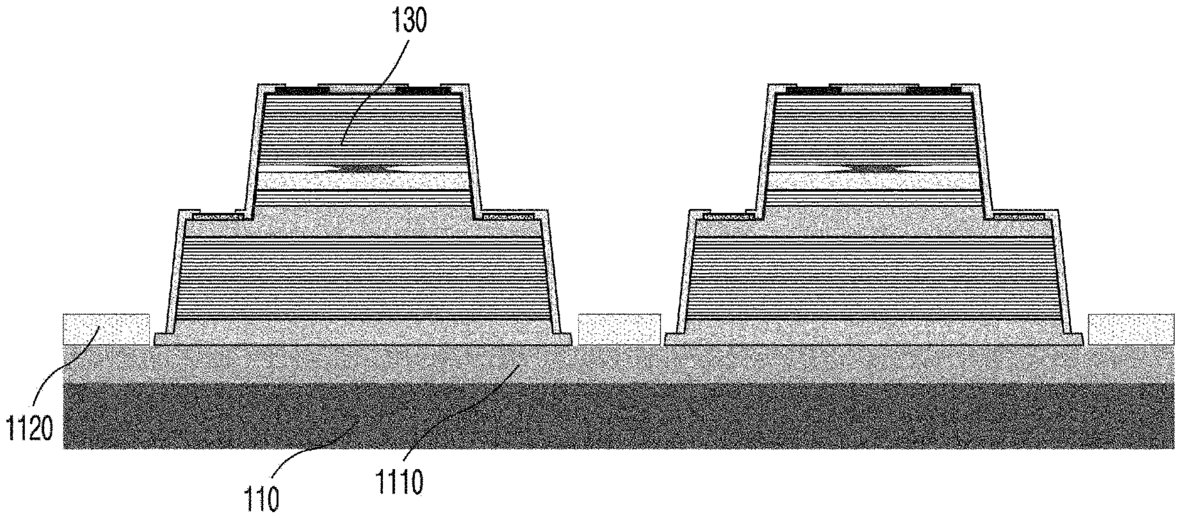

A method of manufacturing the VCSEL array 1100 is partially illustrated in FIGS. 13 to 15.

FIGS. 13 to 15 are diagrams illustrating some of a method of manufacturing the VCSEL array according to the second embodiment of the present disclosure.

As illustrated in FIG. 13, the first electrode 1110 is disposed on the substrate 110.

Next, as illustrated in FIG. 14, the dam 1120 having a form that complies with the number of output parts included in the VCSEL chip 130 to be disposed is disposed on the first electrode 1110. Like FIG. 11, FIG. 14 illustrates that the dam 1120 has been disposed if the VCSEL chip 130 having one output part is disposed, but the present disclosure is not limited thereto Next, as illustrated in FIG. 15, the VCSEL chip 130 is disposed within the hollow of the dam 1120. Power is applied to the first electrode 1110. The VCSEL chip 130 is self-assembled within the hollow of the dam 1120.

Subsequent processes are performed without any change according to the processes described with reference to FIGS. 8 to 10, so that the VCSEL array 1100 is manufactured.

Figure 16:
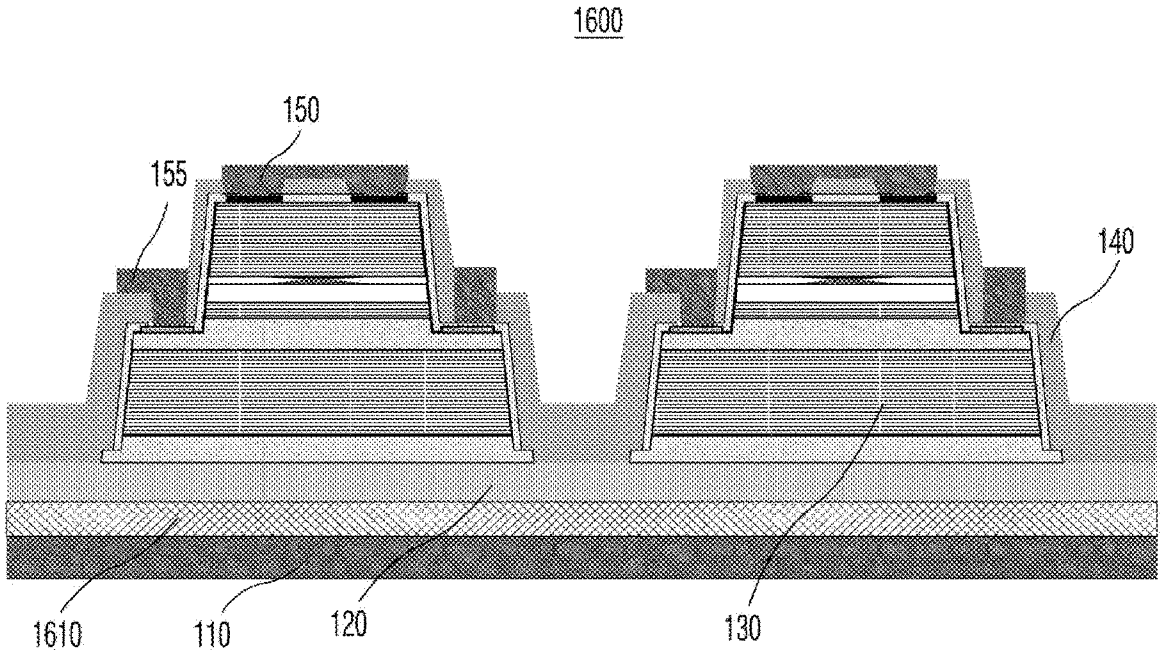
FIG. 16 is a cross-sectional view of a VCSEL array according to a third embodiment of the present disclosure.

FIG. 16 is a cross-sectional view of a VCSEL array according to a third embodiment of the present disclosure.

Referring to FIG. 16, a VCSEL array 1600 according to the third embodiment of the present disclosure includes a substrate 110, an adhesive layer 120, a VCSEL chip 130, a polymer 140, interconnectors 150 and 155, and an electrode 1610. Components having the same reference numerals as components of the VCSEL array 100, among the components of the VCSEL array 1600, perform the same operations as the components of the VCSEL array 100, and thus a detailed description thereof is omitted.

The VCSEL array 1600 includes the electrode 1610 between the substrate 110 and the adhesive layer 120. The electrode 1610 has a different form depending on whether the VCSELs 130 within the VCSEL array 1600 are connected in series or in parallel. A more detailed structure of the VCSEL array 1600 is illustrated in FIGS. 17 to 20.

Figure 17:
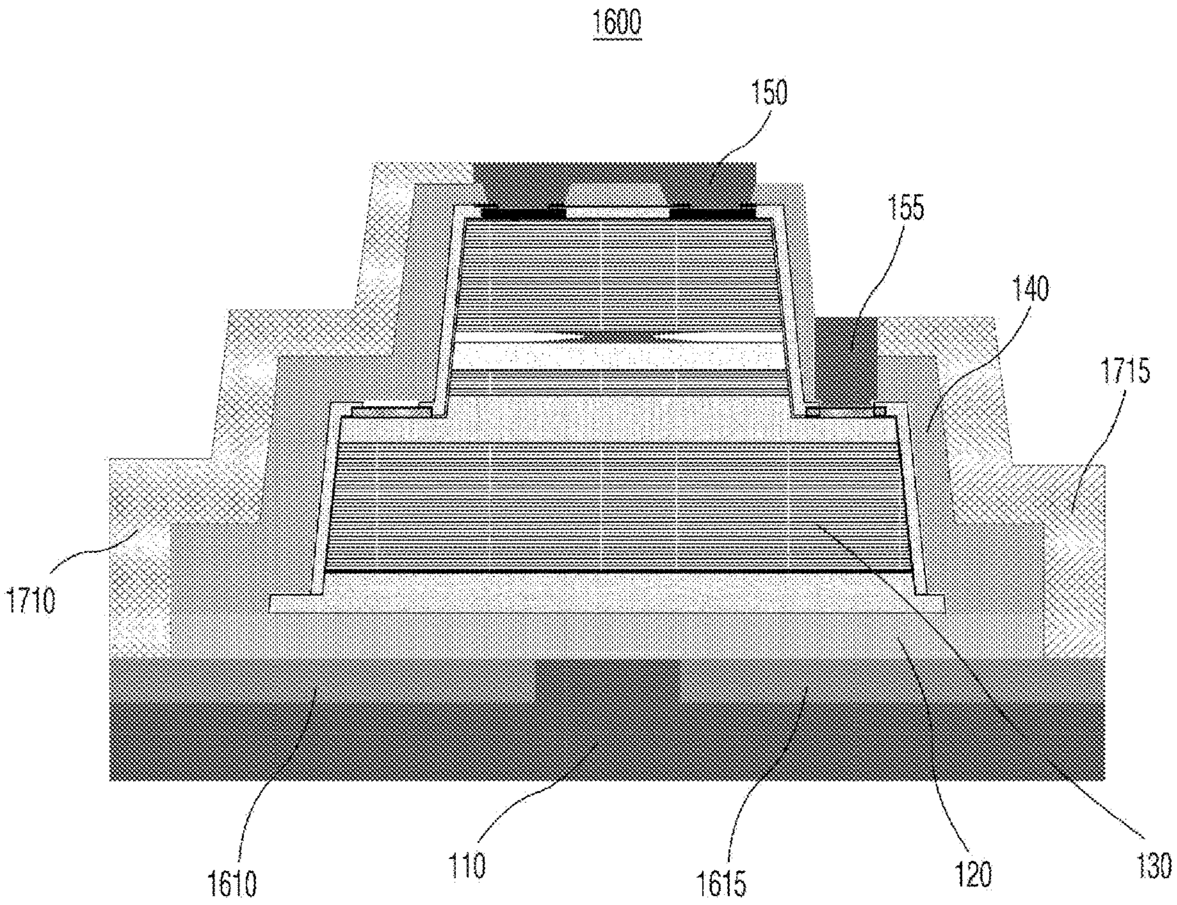
FIG. 17 is a cross-sectional view of the VCSEL array when VCSELs within the VCSEL array are connected in parallel according to the third embodiment of the present disclosure.
Figure 18:
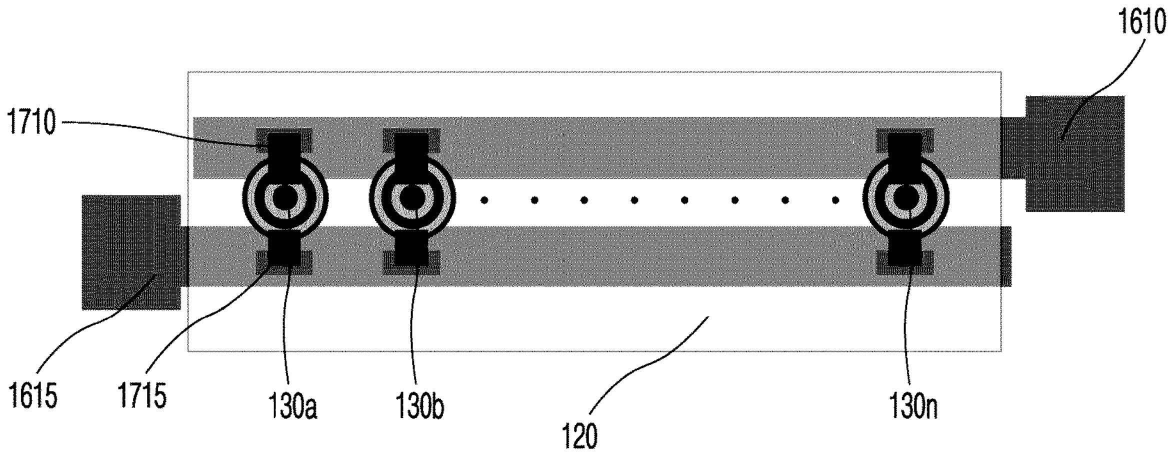
FIG. 18 is a perspective plan view of the VCSEL array when the VCSELs within the VCSEL array are connected in parallel according to the third embodiment of the present disclosure.

FIG. 17 is a cross-sectional view of the VCSEL array when the VCSELs within the VCSEL array are connected in parallel according to the third embodiment of the present disclosure. FIG. 18 is a perspective plan view of the VCSEL array when the VCSELs within the VCSEL array are connected in parallel according to the third embodiment of the present disclosure.

Referring to FIGS. 17 and 18, electrodes 1610 and 1615 each have a bar form, and are arranged at an interval. VCSEL chips 130 (130*a* to 130*n*) are disposed to partially come into contact with the electrodes 1610 and 1615.

The adhesive layer 120 is coated on the electrodes 1610 and 1615 so that the VCSEL chip 130 is partially brought into contact with the electrodes 1610 and 1615 and fixed thereto. The adhesive layer 120 has opened forms (without being coated) at locations at which the interconnectors 1710 and 1715 are disposed from the electrodes 1610 and 1615, respectively, so that the interconnectors 150 and 155 and interconnectors 1710 and 1715 are connected, respectively. Accordingly, the electrodes 1610 and 1615 and the interconnectors 150 and 155 can be connected because the interconnectors 1710 and 1715 may protrude on the electrodes 1610 and 1615.

The interconnectors 1710 and 1715 protrude from the electrodes 1610 and 1615 thereon, respectively, and connect the electrodes 1610 and 1615 and the interconnectors 150 and 155. Accordingly, power can be supplied to the VCSEL chips 130 (130*a* to 130*n*) through the electrodes 1610 and 1615 and the interconnectors 150 and 155, and 1710 and 1715.

Figure 19:
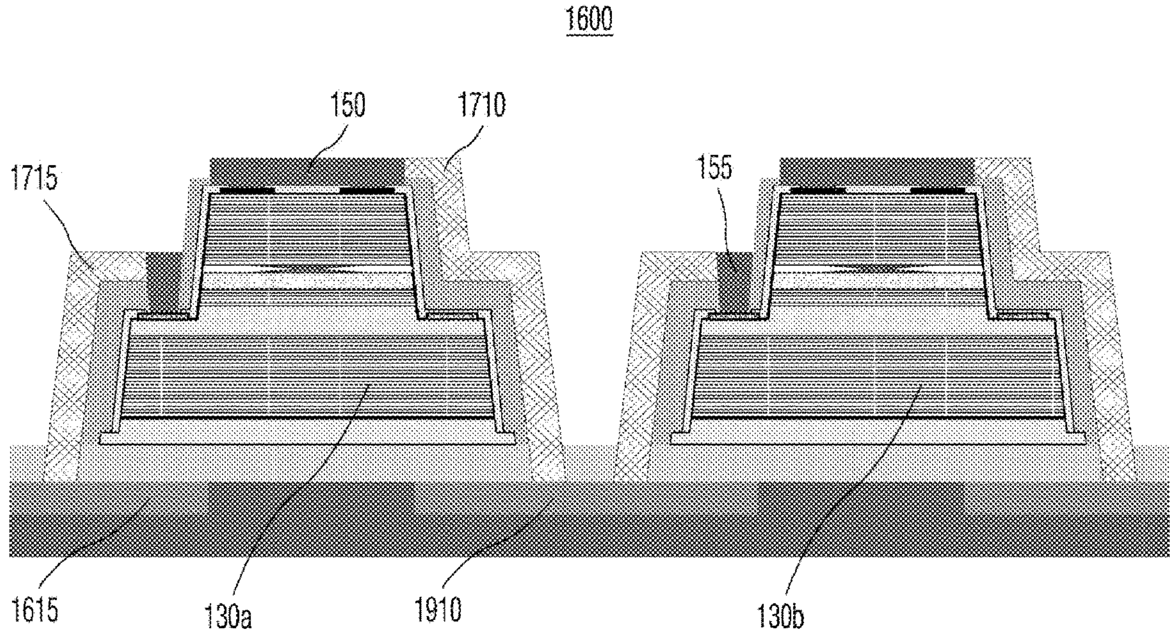
FIG. 19 is a cross-sectional view of the VCSEL array when VCSELs within the VCSEL array are connected in series according to the third embodiment of the present disclosure.
Figure 20:
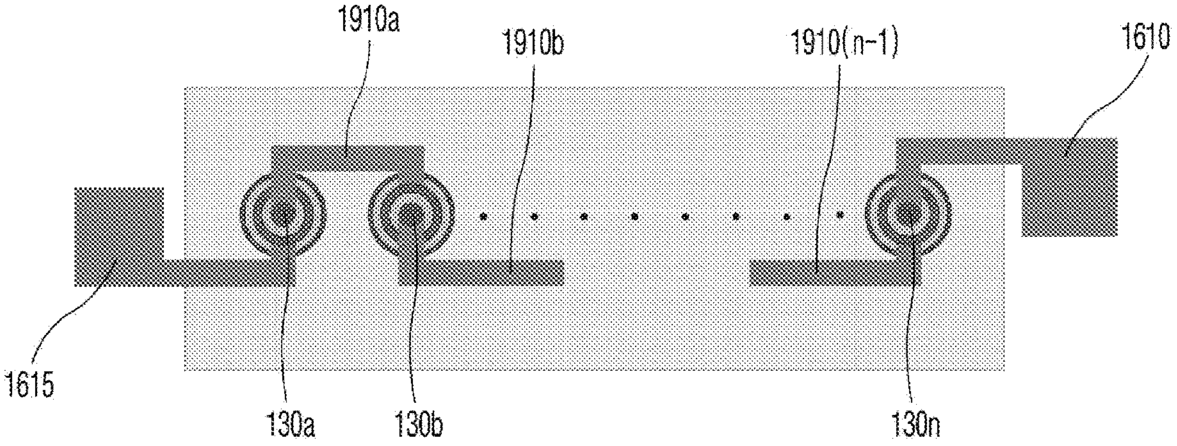
FIG. 20 is a perspective plan view of the VCSEL array when the VCSELs within the VCSEL array are connected in series according to the third embodiment of the present disclosure.

FIG. 19 is a cross-sectional view of the VCSEL array when VCSELs within the VCSEL array are connected in series according to the third embodiment of the present disclosure. FIG. 20 is a perspective plan view of the VCSEL array when the VCSELs within the VCSEL array are connected in series according to the third embodiment of the present disclosure.

The VCSEL chips 130 (130*a* to 130*n*) within the VCSEL array 1600 are not connected in parallel as in FIGS. 17 and 18, but may be connected in series.

The electrodes 1610 and 1615 are disposed with being exposed to both ends of the VCSEL array 1600, and are connected to the VCSELs at both ends of the VCSEL array 1600 therein (via the interconnectors). The interconnector 1710 of one VCSEL within the VCSEL array (except the interconnectors connected to the electrodes 1610 and 1615) and the interconnector 1715 of another VCSEL adjacent to the one VCSEL are connected to one electrode 1910. As interconnectors having different polarities are connected to the one electrode 1910, the VCSELs chips 130*a* to 130*n* may be connected in series.

The VCSEL array 1600 illustrated in FIGS. 19 and 20 includes the electrodes 1610 and 1615 each not having a bar form, and additionally includes the electrodes 1910 (1910*a* to 1910(*n*−1)) that connect interconnectors between adjacent VCSEL chips (e.g., the VCSEL chips 130*a* and 130*b*). Accordingly, the VCSEL array 1600 includes a plurality of VCSEL chips that are connected in series.

The VCSEL array 1600 is manufactured according to the following process.

Before the adhesive layer 120 is coated on the substrate 110, the first electrode 1610 and the second electrode 1615 are formed on the substrate 110.

Next, the adhesive layer 120 is coated on the substrate 110 and the electrodes 1610 and 1615. The adhesive layer 120 is opened at locations at which the interconnectors 1620 and 1625 will protrude from the electrodes 1610 and 1615 thereon, respectively.

Next, after the processes described with reference to FIGS. 7 to 10 are performed, the interconnectors 1620 and 1625 and the interconnectors 150 and 155 are finally connected, so that the VCSEL array 1600 is manufactured.

The above description is merely a description of the technical spirit of the present embodiment, and those skilled in the art may change and modify the present embodiment in various ways without departing from the essential characteristic of the present embodiment. Accordingly, the embodiments should not be construed as limiting the technical spirit of the present embodiment, but should be construed as describing the technical spirit of the present embodiment. The technical spirit of the present embodiment is not restricted by the embodiments. The range of protection of the present embodiment should be construed based on the following claims, and all of technical spirits within an equivalent range of the present embodiment should be construed as being included in the scope of rights of the present embodiment.

What is claimed is:

1. A vertical cavity surface emitting laser (VCSEL) array, comprising:

- a substrate;
- an adhesive layer coated on the substrate;
- a VCSEL chip disposed on the adhesive layer and fixed to the adhesive layer and configured to oscillate light or a laser by being supplied with power;
- a polymer coated on the VCSEL chip and the adhesive layer;

an interconnector electrically connected to the VCSEL chip, wherein the VCSEL chip comprises:

a first reflection part comprising a plurality of distributed Bragg reflector (DBR) pairs;

a second reflection part comprising a plurality of DBR pairs;

a cavity layer that is disposed between the first reflection part and the second reflection part and in which holes that are generated from any one of the first reflection part and the second reflection part and electrons that are generated from the other of the first reflection part and the second reflection part are recombined;

an oxide layer disposed between the cavity layer and the first reflection part or the second reflection part and configured to determine characteristics of a laser to be output and a diameter of an opening;

a contact layer formed within one DBR pair of the second reflection part;

a first metal layer configured to come into contact with the first reflection part so that power is supplied to the first reflection part;

a second metal layer configured to come into contact with the contact layer so that power is supplied to the second reflection part;

an etch-stop layer disposed under the second reflection part and configured to prevent damage to the second reflection part in an etch process; and a passivation layer configured to protect the first reflection part, the second reflection part, the cavity layer, the oxide layer, the contact layer, and the etch-stop layer against an outside, and wherein the etch-stop layer has a mesa structure.

2. The VCSEL array of claim 1, wherein the second reflection part comprises more DBR pairs than the first reflection part.

3. The VCSEL array of claim 1, wherein the contact layer has a mesa structure.

4. The VCSEL array of claim 3, wherein the second metal layer is disposed within the mesa structure and comes into contact with the contact layer.

5. The VCSEL array of claim 1, wherein the passivation layer is applied to a part of or the entire mesa structure of the etch-stop layer.

6. The VCSEL array of claim 1, wherein the VCSEL chip comprises one or more output parts.

7. The VCSEL array of claim 6, wherein the VCSEL chip has a cross section having a preset shape.

8. The VCSEL array of claim 7, wherein the preset shape is identical although the preset shape is rotated at a preset angle.

9. The VCSEL array of claim 7, wherein if the VCSEL chip includes a plurality of output parts, light or a laser having an identical or different wavelength is output from each of the output parts.

10. A method of manufacturing a vertical cavity surface emitting laser (VCSEL) array, the method comprising:

a coating process of coating an adhesive layer on a substrate;

a first arrangement process of disposing the VCSEL chip according to claim 1 on a coating layer;

a coating process of coating and curing a polymer on the VCSEL chip;

a removal process of removing the polymer coated on each metal layer of the VCSEL chip; and a second arrangement process of disposing an interconnector on each metal layer of the VCSEL chip, wherein the etch-stop layer has a mesa structure.

* * * * *